(12) United States Patent
Weloth et al.

(10) Patent No.: US 11,994,807 B2
(45) Date of Patent: May 28, 2024

(54) IN-SITU LITHOGRAPHY PATTERN ENHANCEMENT WITH LOCALIZED STRESS TREATMENT TUNING USING HEAT ZONES

(71) Applicant: Tokyo Electron Limited, Tokyo (JP)

(72) Inventors: Andrew Weloth, Albany, NY (US); Michael Murphy, Latham, NY (US); Daniel J. Fulford, Ballston Lake, NY (US); Steven Gueci, Gansevoort, NY (US); David C. Conklin, Saratoga Springs, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 18/171,989

(22) Filed: Feb. 21, 2023

(65) Prior Publication Data

US 2023/0359128 A1 Nov. 9, 2023

Related U.S. Application Data

(60) Provisional application No. 63/337,708, filed on May 3, 2022.

(51) Int. Cl.
 *G03F 7/00* (2006.01)
(52) U.S. Cl.
 CPC ...... *G03F 7/70625* (2013.01); *G03F 7/70875* (2013.01)
(58) Field of Classification Search
 CPC .......................... G03F 7/70625; G03F 7/70875
 See application file for complete search history.

(56) References Cited

U.S. PATENT DOCUMENTS 8,748,780 B2 * 6/2014 Moro .................. C23C 16/46
 269/21
10,157,747 B2 12/2018 De Villiers
10,396,106 B2 8/2019 Eichler et al.
(Continued)

FOREIGN PATENT DOCUMENTS

WO WO 2020/209780 A1 10/2020
WO WO-2020209780 A1 * 10/2020 ....... C23C 16/45502

OTHER PUBLICATIONS

International Search Report and Written Opinion dated Jul. 24, 2023 in International Application No. PCT/US2023/017875, 9 pages.

*Primary Examiner* — Hung V Nguyen
(74) *Attorney, Agent, or Firm* — Oblon, McClelland, Maier & Neustadt, L.L.P.

(57) ABSTRACT

Aspects of the present disclosure provide a wafer processing device for optimizing wafer shape. For example, the wafer processing device can include a first hot plate, a second hot plate and a controller. The first hot plate can be configured to heat a wafer. For example, the first hot plate can provide uniform heating across a surface of the first hot plate. The second hot plate has multiple heating zones with each heating zone independently controllable such that each heating zone can be set to a temperature value independent of other heating zones. The controller is configured to control the first hot plate to provide the uniform heating, receive a bow measurement from wafer curvature measurement of a wafer, and set the multiple heating zones of the second hot plate to their respective temperature values that correspond to the bow measurement.

13 Claims, 6 Drawing Sheets

(56) References Cited

U.S. PATENT DOCUMENTS

| | | | |
|---|---|---|---|
| 10,431,468 B2 | 10/2019 | De Villiers et al. | |
| 10,453,692 B2 | 10/2019 | De Villiers et al. | |
| 10,475,657 B2 | 11/2019 | De Villiers | |
| 10,622,233 B2 | 4/2020 | Hooge et al. | |
| 10,811,265 B2* | 10/2020 | deVilliers | H01L 21/67288 |
| 11,004,876 B2 | 5/2021 | Eichler et al. | |
| 11,450,552 B2 | 9/2022 | Shirley | |
| 2007/0196011 A1* | 8/2007 | Cox | G01N 21/33 |
| | | | 382/145 |
| 2012/0006263 A1 | 1/2012 | Hashimoto et al. | |
| 2018/0068860 A1 | 3/2018 | De Villiers et al. | |
| 2019/0355768 A1 | 11/2019 | Eichler et al. | |
| 2021/0035850 A1 | 2/2021 | Shirley | |
| 2022/0136109 A1 | 5/2022 | Nilsson et al. | |
| 2023/0005785 A1* | 1/2023 | Shirley | H01L 21/68742 |
| 2023/0161267 A1* | 5/2023 | Fulford | G03F 7/70625 |
| | | | 356/401 |

* cited by examiner

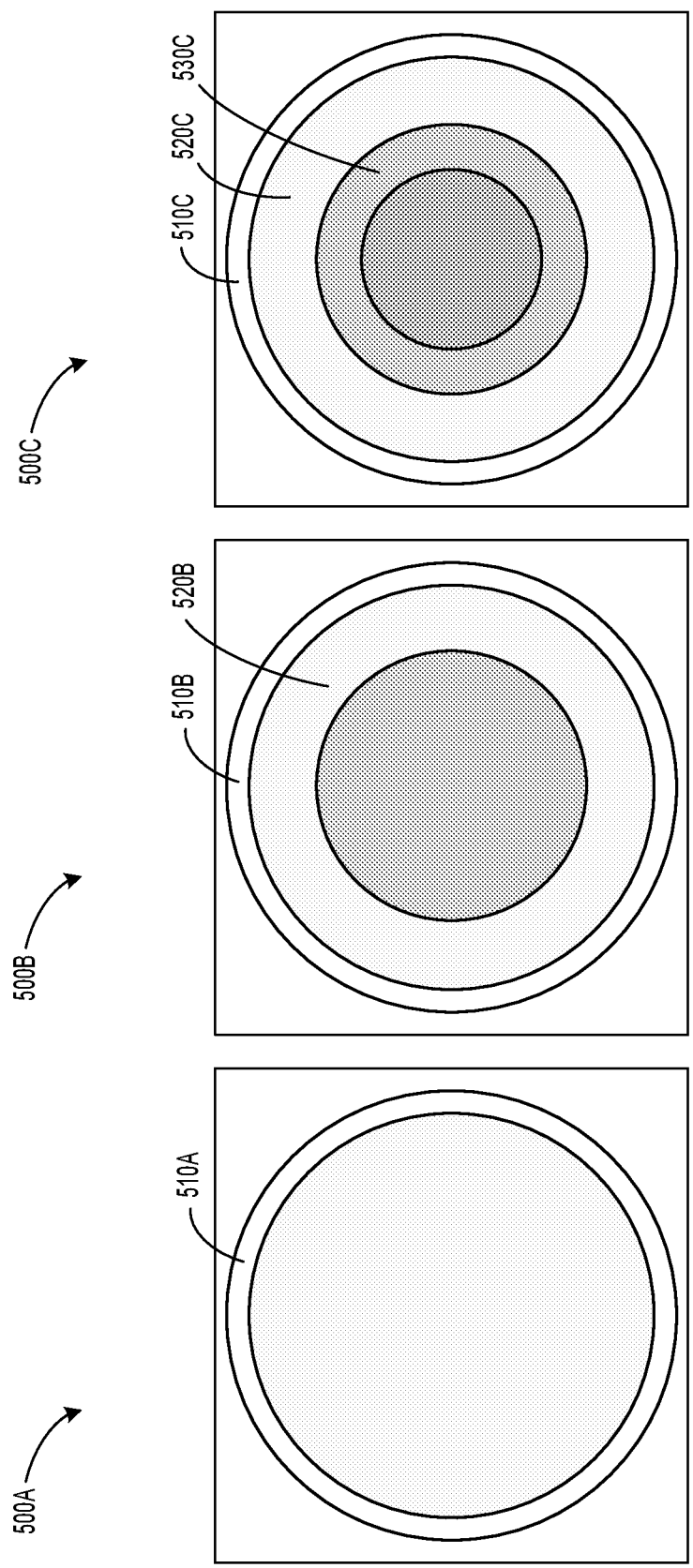

IN-SITU LITHOGRAPHY PATTERN ENHANCEMENT WITH LOCALIZED STRESS TREATMENT TUNING USING HEAT ZONES

INCORPORATION BY REFERENCE

This present disclosure claims the benefit of U.S. Provisional Application No. 63/337,708, "in-situ lithography pattern enhancement with localized stress treatment tuning using heat zones" filed on May 3, 2022, which is incorporated herein by reference in its entirety.

FIELD OF THE INVENTION

The present disclosure relates to semiconductor fabrication, and, more particularly, to wafer curvature, bow and overall wafer shape.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Semiconductor fabrication involves multiple varied steps and processes. One typical fabrication process is known as photolithography (also called microlithography). Photolithography uses radiation, such as ultraviolet or visible light, to generate fine patterns in a semiconductor device design. Many types of semiconductor devices, such as diodes, transistors, and integrated circuits, can be constructed using semiconductor fabrication techniques including photolithography, etching, film deposition, surface cleaning, metallization, and so forth.

Exposure systems (also called tools) are used to implement photolithographic techniques. An exposure system typically includes an illumination system, a reticle (also called a photomask) or spatial light modulator (SLM) for creating a circuit pattern, a projection system, and a wafer alignment stage for aligning a photosensitive resist-covered semiconductor wafer. The illumination system illuminates a region of the reticle or SLM with a (preferably) rectangular slot illumination field. The projection system projects an image of the illuminated region of the reticle pattern onto the wafer. For accurate projection, it is important to expose a pattern of light on a wafer that is relatively flat or planar, preferably having less than 10 microns of height deviation.

SUMMARY

Aspects of the present disclosure provide a wafer processing device for optimizing wafer shape. For example, the wafer processing device can include a first hot plate, a second hot plate and a controller. The first hot plate can be configured to heat a wafer. For example, the first hot plate can provide uniform heating across a surface of the first hot plate. The second hot plate has multiple heating zones with each heating zone independently controllable such that each heating zone can be set to a temperature value independent of other heating zones. The controller can be configured to control the first hot plate to provide the uniform heating, receive a bow measurement from wafer curvature measurement of a wafer, and set the multiple heating zones of the second hot plate to their respective temperature values that correspond to the bow measurement.

In an embodiment, the second hot plate can be positioned adjacent to the first hot plate such that the first hot plate and the second hot plate are in contact with each other. For example, the wafer processing device further includes a wafer support for wafer to be placed thereon, and the controller is further configured to control the wafer support to be closer to the second hot plate than to the first hot plate. As another example, the wafer processing device further includes a wafer support for wafer to be placed thereon, and the controller is further configured to control the wafer support to be closer to the first hot plate than to the second hot plate. In another embodiment, the second hot plate can be positioned opposite to the first hot plate such that the wafer is positioned between the first hot plate and the second hot plate.

In an embodiment, the second hot plate can include multiple channels corresponding to the multiple heating zones, and a heat exchanging fluid flowing through the channels and controlled by the controller based on the bow measurement of the wafer. In an embodiment, the controller can control the heat exchanging fluid to undergo a phase transition from a fluid state to a gas state. For example, the controller can control the temperature of the heat exchanging fluid by changing a pressure thereof.

Aspects of the present disclosure also provide a wafer processing system for optimizing wafer shape. For example, the wafer processing system can include a metrology module, a film formation module and a bake module. The metrology module can be configured to measure a wafer to identify a bow measurement of the wafer. The film formation module can be configured to form a stressor film on the wafer. The stressor film is reactive to heat such that the heat modifies an internal stress of the stressor film. The bake module has multiple heating zones for differentially heating the stressor film corresponding to the bow measurement. The wafer can have a working surface and a backside surface opposite to the working surface, and the stressor film can be formed on the backside surface of the wafer.

In an embodiment, the film formation module can be configured to form the stressor film by a spin-on deposition process. In another embodiment, the bake module can include a first hot plate that is configured to generate uniform heating across a surface of the first hot plate, and a second hot plate that includes the multiple heating zones.

Aspects of the present disclosure also provide a method for optimizing wafer shape. For example, the method can include receiving a wafer having a working surface and a backside surface opposite to the working surface, measuring the wafer to identify a bow measurement of the wafer, and forming a stressor film on the backside surface of the wafer. The stressor film can be reactive to heat such that the heat modifies an internal stress of the stressor film. The method can further include modifying the internal stress of the stressor film using a pattern of heat applied via a hot plate having multiple heating zones. The pattern of heat corresponds to the bow measurement of the wafer.

In an embodiment, the working surface of the wafer can be with at least partially fabricated devices. In another embodiment, the wafer can have an amount of wafer bow resulting from one or more microfabrication steps.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

Various embodiments of this disclosure that are proposed as examples will be described in detail with reference to the following figures, wherein like numerals reference like elements, and wherein:

FIGS. 5A to 5C are schematic views of three exemplary first hot plates of the bake module shown in FIGS. 4A and 4B in accordance with some embodiments of the present disclosure.

DETAILED DESCRIPTION

Figure 1:
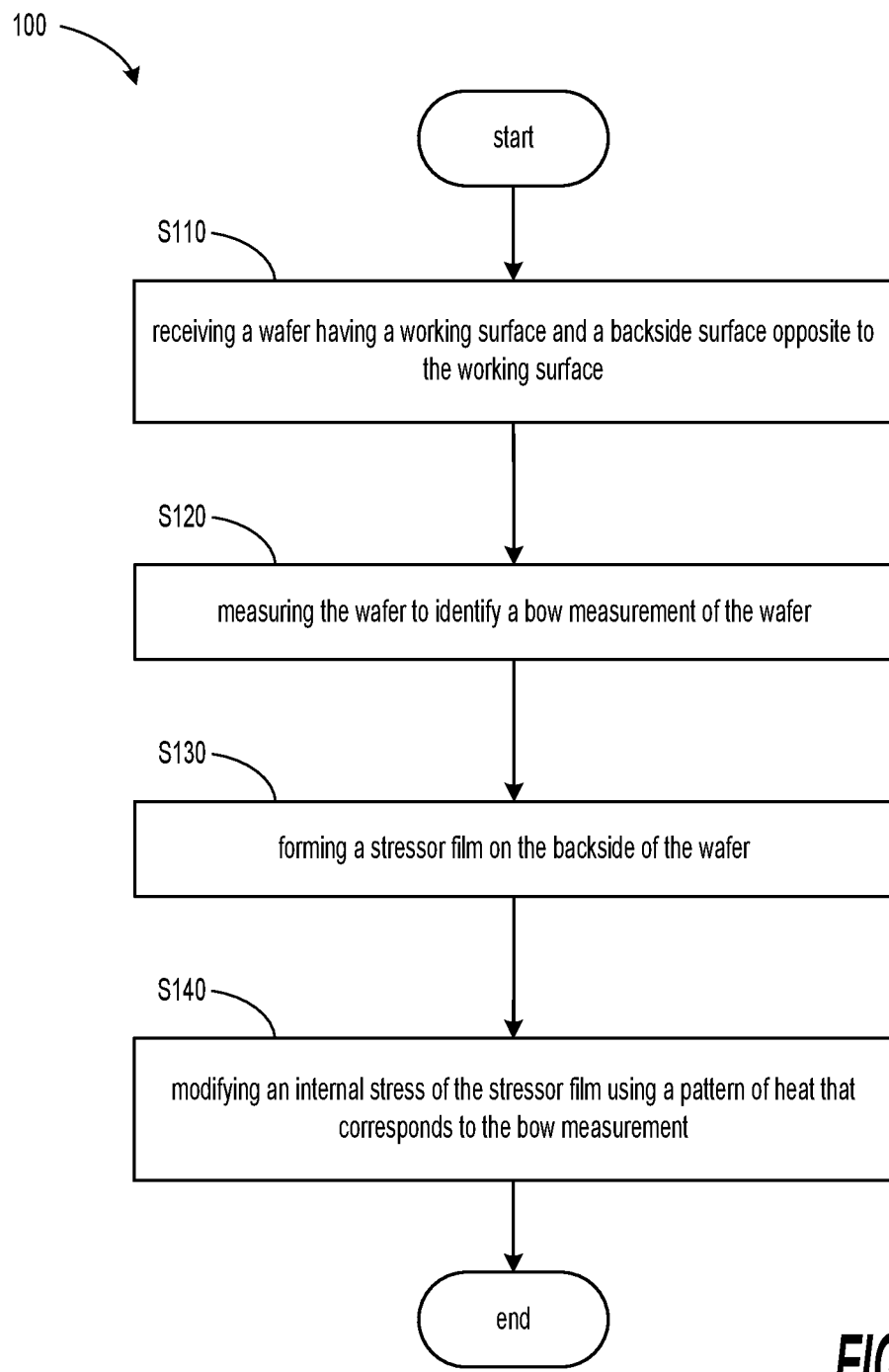
FIG. 1 is a flow chart illustrating an exemplary method for correcting or modifying wafer bow in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, spatially relative terms, such as "top," "bottom," "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Semiconductor fabrication involves multiple varied steps and processes. One typical fabrication process is known as baking. Typically, before any semiconductor fabrication process there is a bake process to set a substrate or wafer and process stack to a target temperature. This temperature is in generally as uniform as possible as many processes are impacted by the temperature of the wafer during processing. For example, in a spin-on film deposition process the wafer will be placed in a bake module and cooled to stabilize the temperature of the wafer to 32° C. and be further processed after the temperature of the wafer is stable. After the spin-on deposition process is performed, the wafer with a film or photo resist deposited thereon is baked again on a different hot plate stabilizing to 90° C. to stabilize the deposited film or to crosslink the exposed photo resist. Hot plates can be characterized as cold hot plates (<50° C.), hot plates (<400° C.), and very hot plates (<900° C.).

Microfabrication of a semiconductor structure begins with a flat substrate or wafer. During microfabrication of the semiconductor structure, multiple processing steps are executed that can include depositing material on the wafer, removing material, implanting dopants, annealing, baking, and so forth. Different materials and structural formations thus formed can cause internal stresses in the wafer which result in bowing of the semiconductor structure, which in turn affects overlay and typically results in overlay errors of various magnitudes. Simple bow correction or modification (e.g., first order correction) can be realized by depositing a stressor film on a backside surface of the wafer. This technique can help to correct or modify a wafer with a bowl shape. This typically requires transferring the wafer to a vapor deposition tool prior to subsequent processing.

Techniques disclosed herein define process flows and wafer processing device and system to achieve optimum wafer shape (using localized stress treatment of the semiconductor wafer lattice) prior to a photo process that is used on a working surface of the wafer. Process flows disclosed herein include a disposable lattice-tuning film on either the backside surface or the working surface of the wafer as one option. Another option is to leave the lattice tuning film in place for subsequent processing steps.

Techniques disclosed herein include a hot plate having multiple heating zones that are used to create a target heat signature. Process flows can be tuned/changed using a target heat signature. Process flows use a hot plate used as an independent processing step. Such stress modification of wafers by a hot plate having multiple heating zones can be used with spin-on stressor films. A stressor material can be deposited by spin-on deposition, and then a heater array is used to crosslink the stress material or stress signature into a stressor film using a coater-developer tool without any lithographic exposure or etching. Accordingly, wafer shape modification can be realized by spin coat, then bake, then develop. As can be appreciated, without photolithographic correction, a given correction signature will have a lower resolution of stress modification, but for first order correction and second order correction this lower resolution is sufficient.

Also the process flows may go through iterations at the same step or subsequent process steps to maintain optimum wafer shape at all process locations that require lithography.

A feature herein is that no mask is required with this in-situ pattern enhancement technique.

By using a wafer backside or working surface stressor film that may be heated in different zones (either by a wafer chuck or laser as some examples) to modify the initial internal stress from the deposited condition. This will be possible because accessible chucks can be modified to have greater than 50 micro temperature locations on the back of the wafer. One unique aspect is that the deposited stressor film on the backside surface of the wafer can be either compressive stress, neutral stress, or tensile stress in the deposited condition, then will be modified in the various micro temperature regions to produce localized stress (compressive, tensile, neutral) to reduce wafer bow to enhance lithography precision (because optimum wafer shape is achieved).

Figure 2A:
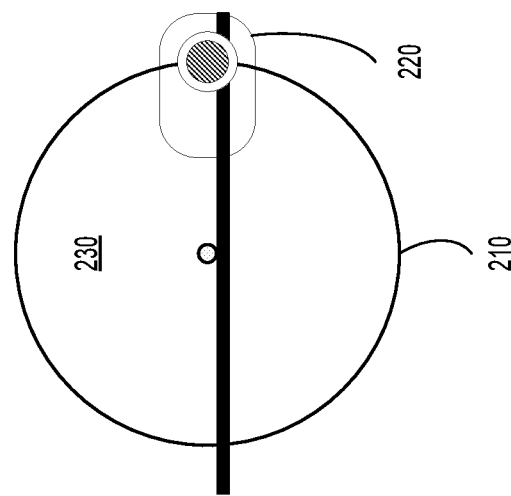
FIGS. 2A to 2C show hardware used in the exemplary method shown in FIG. 1.
Figure 2B:
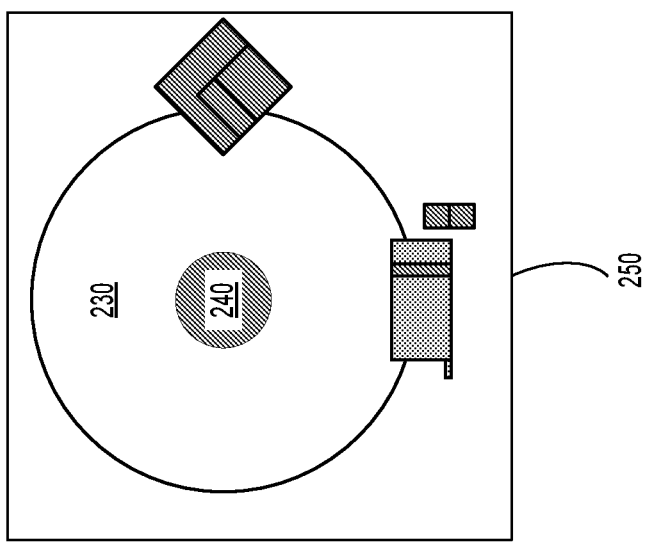
Figure 2C:
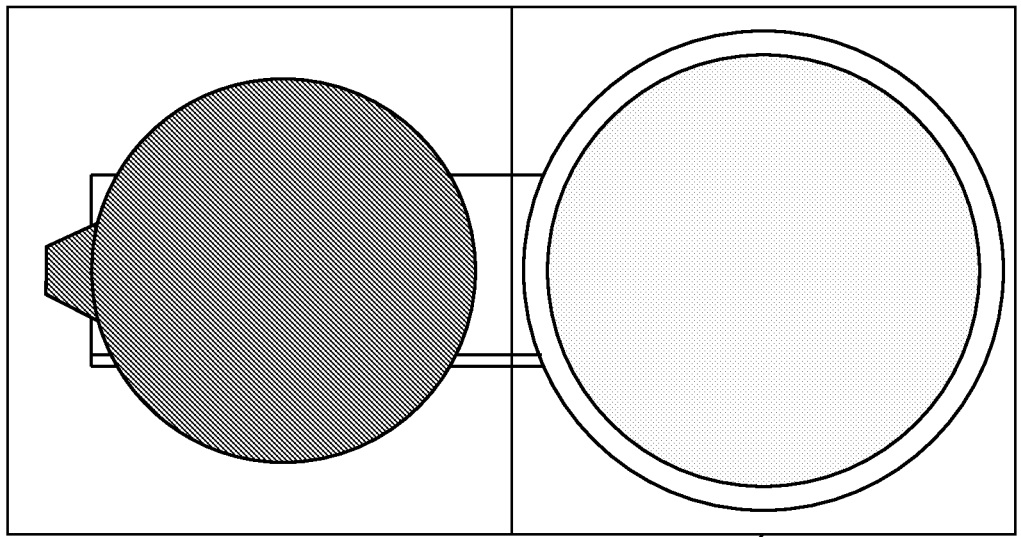

FIG. 1 is a flow chart of an exemplary method 100 for correcting or modifying wafer bow in accordance with some embodiments of the present disclosure. FIGS. 2A to 2C show hardware, e.g., metrology module and bake module, used in the exemplary method 100. The method 100 can correct or modify first, second or higher order or complex bowing of a wafer. The method 100 starts with step S110, at which a wafer 210 (shown in FIG. 2A) is received that has a backside surface 230 and a working surface (not shown) opposite to the backside surface 230. The working surface may be with at least partially fabricated devices, the microfabrication steps of which may result in an amount of wafer bow of the wafer 210.

At step S120, the wafer 210 is measured to identify a bow measurement of the wafer 210. For example, a metrology module 220 (shown in FIG. 2A) is used to identify the bow measurement, e.g., relative z-height deviation values, of the wafer 210

At step S130, a stressor film 240 (or a stress-modification film) (shown in FIG. 2B) is formed on the backside surface 230 of the wafer 210. For example, the wafer 210 can be flipped with the backside surface 230 facing upward, and the stressor film 240 can be formed on the backside surface 230 by a film deposition module (or a coater) 250 during a spin-on film deposition process, in which an amount of a stressor material 240 is deposited on the backside surface 230 of the wafer 210 while the wafer 210 is rotating, thus causing a solvent in the stressor material 240 to evaporate to form the stressor film 240. The stressor film 240 is reactive to heat such that applied heat modifies an internal stress of the stressor film 240. Various materials can be selected for use in the stressor film 240, e.g., carbon nanotube boron nitride.

At step S140, the internal stress of the stressor film 240 is corrected or modified using a pattern of heat that corresponds to the bow measurement. For example, the stressor film 240 can be transferred to a bake module 260 (shown in FIG. 2C), which includes a first hot plate that has one or more channels to perform a uniform baking process and a second hot plate that has multiple heating zones to perform a differential heat signature baking process corresponding to the bow measurement of the wafer 210. The multiple heating zones can be controlled individually. Depending on material selected, the differential heat signature baking process can either increase or decrease internal compressive or tensile stress at point locations across the wafer 210, which in turn modifies a global shape of the wafer 210. Steps S120 to S140 can be iterated until the wafer 210 has an average z-height deviation value of less than a threshold, e.g., 10 microns, and is close to being flat or considered flat for overlay improvement herein. Then the wafer 210 can be flipped over for continued processing on the working surface. The stressor film with its internal stress modified can be removed or left in place during the continued processing.

Figure 3:
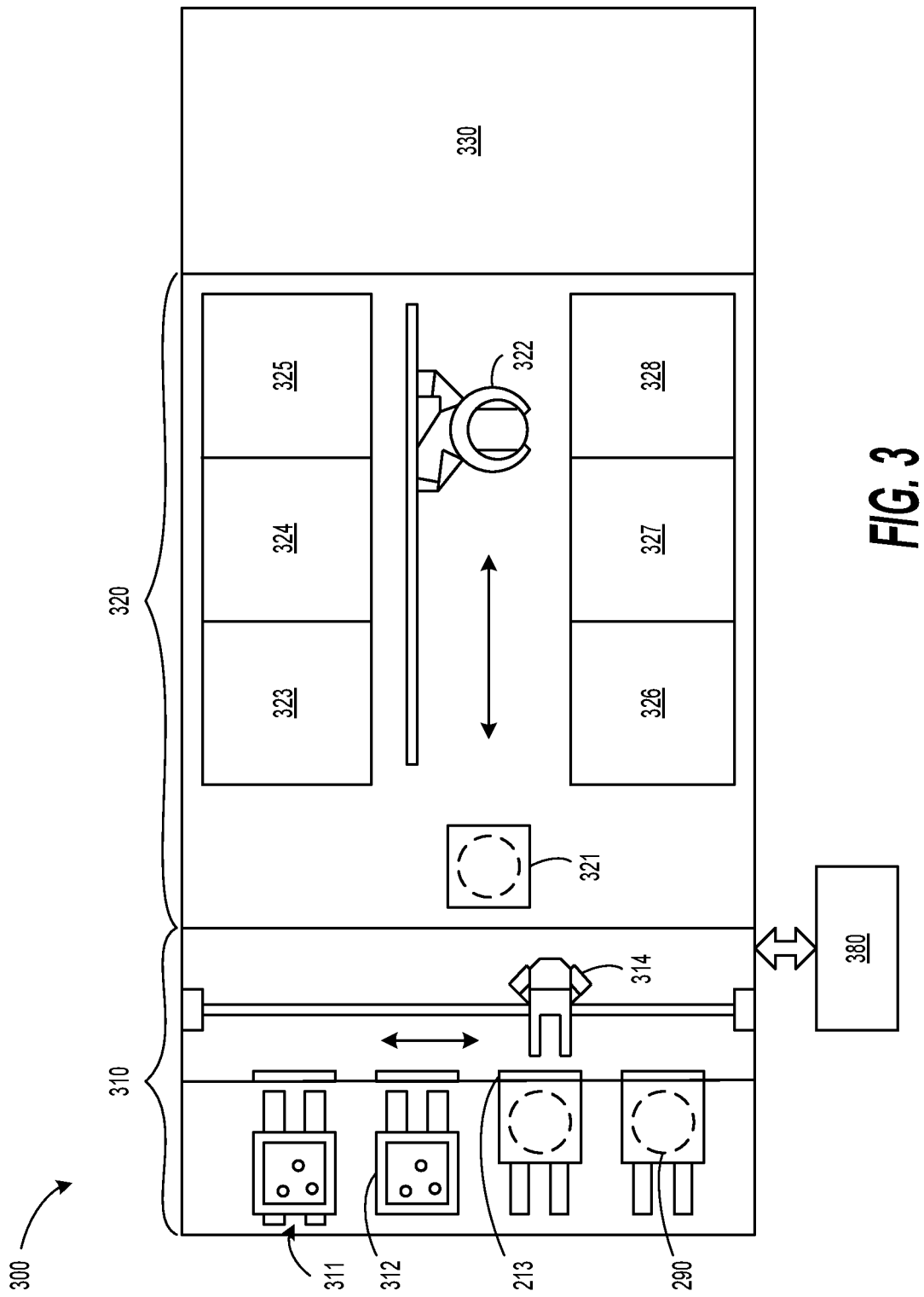
FIG. 3 is a plan view of an exemplary wafer processing system for correcting or modifying wafer bow in accordance with some embodiments of the present disclosure.

FIG. 3 is a plan view of an exemplary wafer processing system 300, e.g., a track lithography tool, for correcting or modifying wafer bow in accordance with some embodiments of the present disclosure. The wafer processing system 300 includes various wafer handling components or carriers, along with several stages, e.g., a carrier stage 310 and a treatment stage 320. The carrier stage 310 includes one or more pod assemblies 311 that are configured to receive one or more wafer cassettes 312 that are configured to contain one or more wafers 290, e.g., the wafer 210 shown in FIG. 2A, that are to be processed in the wafer processing system 300. Doors 313 can open to access the wafers 290 contained in the wafer cassettes 312. A carrier transfer robot 314 can move up and down and transfer the wafers 290 from the wafer cassettes 312 to a shelf unit 321 installed in the treatment stage 320 for storing the wafers 290 temporarily.

The treatment stage 320 includes a variety of treatment modules, e.g., treatment modules 323-328, and a treatment transfer robot 322. The treatment transfer robot 322 is configured to access the shelf unit 321 and the treatment modules 323-328 and transfer the wafers 290 among the treatment modules 323-328 for various processing. In an embodiment, the treatment transfer robot 322 can flip and rotate the wafers 290. The modules 323-328 can include one or more metrology modules 323, e.g., the metrology module 220 shown in FIG. 2A, which are configured to measure an amount of wafer bow of the wafers 290 and provide bow measurements to the wafer processing system 300. Bow measurements can include measuring a degree of convexity or concavity, or mapping z-height deviation values on the wafers 290 relative to one or more reference z-height deviation values. In other words, z-height deviation values are spatially mapped, such as with coordinate locations, to identify z-height deviation values across a surface of the wafer 290. Bow measurements and z-height deviation values can be mapped at various resolutions depending on types of metrology equipment used and/or a resolution desired.

The bow measurements can include raw bow data, or be represented as a bow signature with relative z-height deviation values. Note that in many embodiments, the reference z-height deviation values may be all close to zero and thus representative of a wafer that is close to being flat. For example, a wafer that is close to being flat or considered flat for overlay improvement herein can be a wafer having an average z-height deviation value of less than 10 microns. In some embodiments, the reference z-height deviation values can represent some non-planar shape, but which shape is, notwithstanding, useful for overlay error correction—especially for particular stages of micro fabrication. Techniques herein enable correction of bowing that is greater than 10 microns. The metrology module 323 is configured to measure a wafer 290 that has a working surface and a backside surface opposite to the working surface. The wafer 290 may have an initial wafer bow value resulting from one or more micro fabrication processing steps that have been executed to create at least part of a semiconductor device on the working surface of the wafer 290. For example, field-effect transistors (FETs) may be completed or only partially completed on the working surface of the wafer 290.

The treatment modules 323-328 can also include one or more film formation modules 324, e.g., the film formation module 250 shown in FIG. 2B, that are configured to form one or more films on a surface of the wafer 290 being processed. The film formation module 324 can be configured to deposit a stressor film, e.g., the stressor film 240 shown in FIG. 2B, on the backside surface of the wafer 290 using chemical vapor deposition, atomic layer deposition, spin-on film deposition process, or other deposition techniques. For example, in the spin-on film deposition an amount of a stressor material is deposited on the backside surface of the wafer 290 while the wafer 290 is rotating, thus causing a solvent in the stressor material to evaporate and the properties of the deposited stressor material to change, to promote the adhesion of the stressor material to the backside surface of the wafer 290. The film formation module 324 and the metrology module 323 can be installed on a common platform having an automated wafer handling system that automatically moves the wafer 290 from the metrology module 323 to the film formation module 324.

The treatment modules 323-328 can also include one or more bake modules 325, e.g., the bake module 260 shown in FIG. 2C, that are configured to bake the wafer 290 to a target temperature. For example, the bake module 325 can bake and stabilize the wafer 290 at 32° C. or 90° C. As another example, the bake module 325 can bake the wafer 290 with a stressor film formed thereon using a pattern of heat that correspond to a bow measurement of the wafer 290, to correct or modify an internal stress of the stressor film.

The wafer processing system 300 further includes a controller 380. The controller 380 can be a computer processor located within the wafer processing system 300, or located remotely but being in communication with components, e.g., the metrology module 323, the film formation module 324 and the bake module 325, of the wafer processing system 300. In an embodiment, the controller 380 is configured to control the metrology module 323 to measure a wafer 290 to identify a bow measurement of the wafer 290, receive the bow measurement from the metrology module 323, control the film formation module 324 to form a stressor film on the backside surface of the wafer 290, and control the bake module 325 to differentially bake the wafer 290 with the stressor film formed thereon using a pattern of heat corresponding to the bow measurement, to correct or modify the internal stress of the stressor film. The film formation module 324, the bake module 325 and the controller 380 are referred to as a wafer processing device. The wafer processing system 300 can also include other stages or components, e.g., a stepper/scanner 330. The stepper/scanner 330 can be detached from the treatment stage 320 since the throughput of the stepper/scanner 330 is often many times greater than the throughput of the carrier stage 310 and the treatment stage 320, and thus dedicating the stepper/scanner 330 to a single treatment stage wastes the stepper/scanner's excess throughput capacity.

Figure 4A:
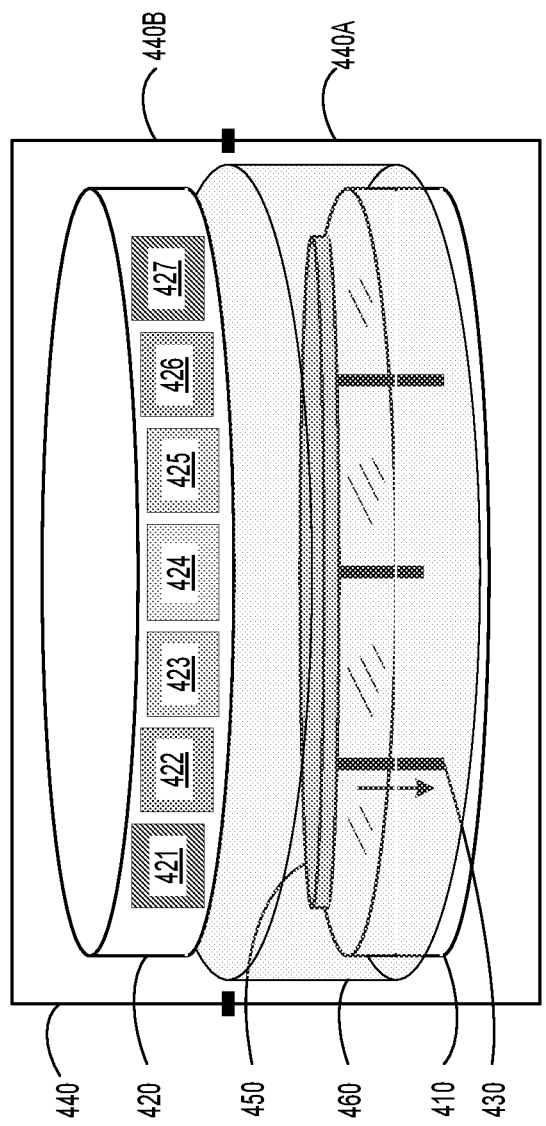
FIGS. 4A and 4B are side views of an exemplary bake module of the wafer processing system shown in FIG. 3 in accordance with some embodiments of the present disclosure.
Figure 4B:
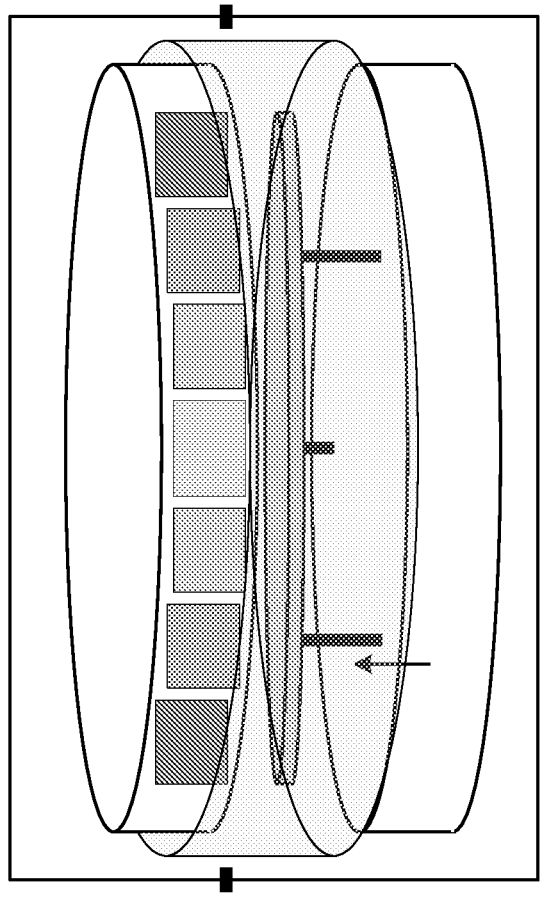
Figure 6C:
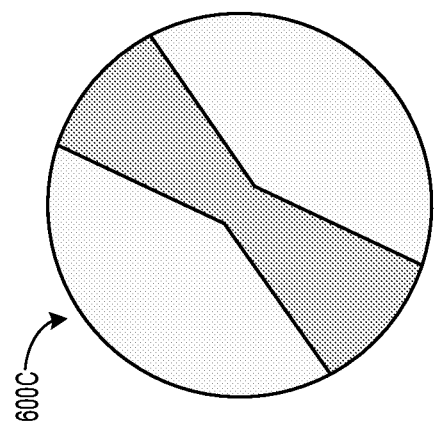
FIGS. 6A to 6F are schematic views of six exemplary second hot plates of the bake module shown in FIGS. 4A and 4B in accordance with some embodiments of the present disclosure.
Figure 6F:
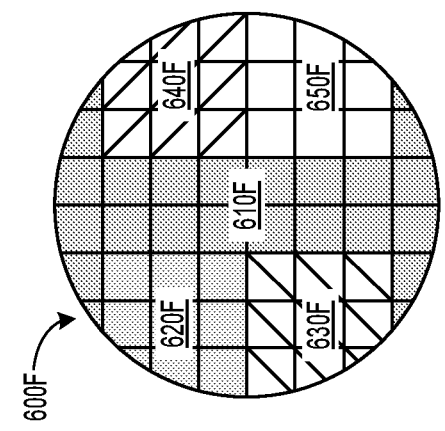
Figure 6B:
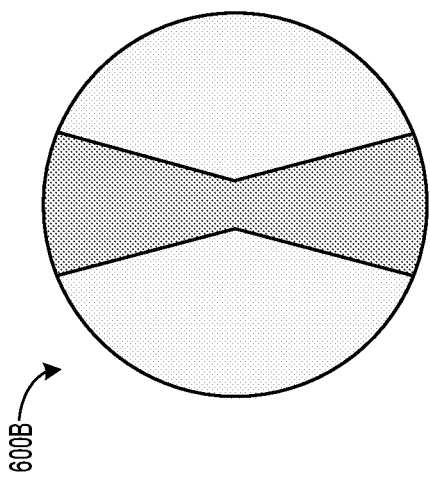
Figure 6E:
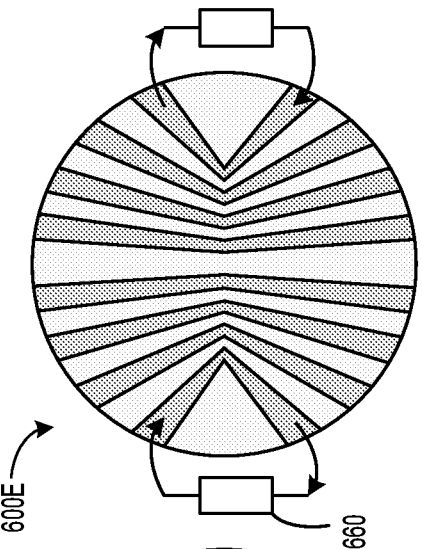
Figure 6A:
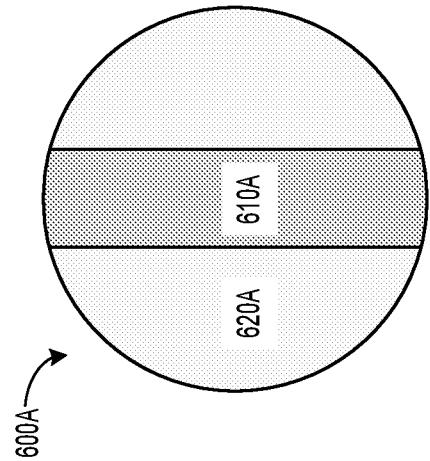
Figure 6D:
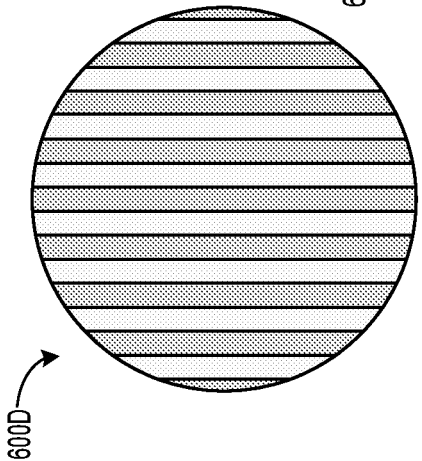

FIGS. 4A and 4B are side views of an exemplary bake module (or a wafer processing device) 400, e.g., the bake module 325, in accordance with some embodiments of the present disclosure. The bake module 400 is configured to bake a wafer, e.g., the wafer 290, with layers and/or films, e.g., a stressor film, formed on working and/or backside surfaces thereof. The bake module 400 includes a first hot plate (or a global hot plate) 410, a second hot plate (or a local hot plate) 420, and a wafer support (or holder) 450 for a wafer to be placed thereon that is to be baked. The second hot plate 420 includes multiple heating zones 421 to 427. The first hot plate 410 and the second hot plate 420 can be made from aluminum, graphite, aluminum-nitride, or other thermally conductive materials. The first hot plate 410, the second hot plate 420 and the wafer support 450 are enclosed in a housing 440. The housing 440 is configured to isolate the processes performed in the bake module 400 from the surrounding environment. For example, the housing 440 can thermally isolate and minimize contamination of the bake module 400 from the surrounding environment. In an embodiment, the housing 440 can include a lower portion 440A where the first hot plate 410 can be installed and an upper portion (e.g., a lid) 440B where the second hot plate 420 can be installed. The upper portion 440B can move vertically to open and close the bake module 400. For example, when a wafer is baked in the bake module 400, the upper portion 440B can be controlled to move vertically down toward the lower portion 440A until the housing 440 is enclosed, and the second hot plate 420, if integrated with the upper portion 440B, is fixed.

A lift assembly 430, including three lift pins, for example, is configured to raise and lower the wafer support 450. For example, the lift assembly 430 can lower the wafer support 450 such that the wafer 290 placed thereon is close to the first hot plate 410 during a globally heating process, as shown in FIG. 4A. As another example, the lift assembly 430 can raise the wafer support 450, in variable heights, for example, such that the wafer 290 placed thereon is close to the second hot plate 420 during a locally heating process, as shown in FIG. 4B.

In the example embodiment, the wafer support 450 is disposed such that the wafer 290 can be disposed between the first hot plate 410 and the second hot plate 420. In another embodiment, the second hot plate 420 can be disposed over the first hot plate 410, and the wafer 290 is disposed over the second hot plate 420. In yet another embodiment, the first hot plate 410 can be disposed over the second hot plate 420, and the wafer 290 is disposed over the first hot plate 410. In some other embodiments, two sets of the first hot plate 410 and the second hot plate 420 can be disposed over and below the wafer 290, respectively.

The wafer 290 can rest on pins or protrusions (not shown) that are embedded in the surface of the first hot plate 410 or the second hot plate 420 so that only a small gap is maintained between the wafer 290 and the first hot plate 410 or the second hot plate 420 to reduce particle generation. While reducing the number of particles generated, the pins may tend to reduce the thermal coupling between the wafer 290 and the first hot plate 410 or the second hot plate 420. Therefore, it is often desirable to minimize the height, i.e., the gap, of the pins from the surface of the first hot plate 410 or the second hot plate 420 to improve the thermal coupling, while also assuring that the wafer 290 will not touch the surface of the first hot plate 410 or the second hot plate 420.

In an embodiment, the bake module 400 can further include a shutter ring 460. The shutter ring 460 can be controlled to move vertically to allow a wafer to be transferred into the bake module 400 and to seal the bake module 400 from external environment. For example, the shutter ring 460 and the lift assembly 430 can be controlled by a common lifting cylinder (not shown) to move vertically up and down at the same time.

FIGS. 5A to 5C are schematic views of three exemplary first hot plates 500A, 500B and 500C, e.g., the first hot plate 410, in accordance with some embodiments of the present disclosure. The first hot plates 500A to 500C each are configured to heat the wafer 290 globally and generate uniform heating across surfaces of the first hot plates 500A to 500C. The first hot plate 500A has one circular channel 510A, the first hot plate 500B has two concentric channels 510B and 520B, and the first hot plate 500C has three concentric channels 510C, 520C and 530C. The first hot plates 500A to 500C can each include any number, any shape of channels.

A heat exchanging fluid (not shown) continually flows through the channels. A fluid temperature controller, e.g., the controller 380, can be configured to control the temperature of the heat exchanging fluid and thus the temperature of the first hot plates 500A to 500C. The heat exchanging fluid may be, for example, a perfluoropolyether, that can be controlled to a temperature between about 30° C. and about 250° C. The heat exchanging fluid may also be a temperature controlled gas, such as argon or nitrogen.

FIGS. 6A to 6F are schematic views of six exemplary second hot plates 600A, 600B, 600C, 600D, 600E and 600F, e.g., the second hot plate 420, in accordance with some embodiments of the present disclosure. The second hot plates 600A to 600F are configured to heat the wafer 290 locally, and each include multiple heating zones that are independently controllable by a controller, e.g., the controller 380, such that each heating zone can be set to a temperature value independent of the other heating zones. In some embodiments, a controller, e.g., controller 380, can also independently control a rate of change in temperature for each heating zone. For example, the controller 380 can receive a bow measurement of the wafer 290 identified by the metrology module 323, and control the heating zones of each of the second hot plates 600A to 600F individually such that the second hot plates 600A to 600F each have a spatial heat signature corresponding to the bow measurement. The multiple heating zones can be arranged in one dimension or two dimensions with one or more rectangular or other shapes of strips. For example, the second hot plate 600A includes a rectangular heating zone 610A and a heating zone 620A that sandwiches the heating zone 620A. As another example, the second hot plate 600F includes multiple heating zones that are arranged in an array and grouped into five heating groups 610F, 620F, 630F, 640F and 650F each including one or more heating zones.

In an embodiment, the second hot plates 600A to 600F each include multiple channels corresponding to the multiple heating zones thereof. A heat exchanging fluid (not shown) can also continually flow through the channels and be controlled by the controller 380. Accordingly, the spatial heat signature of the second hot plates 600A to 600F can be controlled by the controller 380 based on the bow measurement of the wafer 290 identified by the metrology module 323. The heat exchanging fluid can be liquid, e.g., water, or gas, e.g., inert gas, air, nitrogen or carbon dioxide, and, after reaching a predetermined temperature, enter each channel from an inlet thereof by using an ejector 660. After flowing through an interior portion of the second hot plate 600E, for example, the fluid exhausts from an outlet of the channel by the ejector 660. In an embodiment, the liquid, e.g., water, can be heated to its boiling point, and undergo a phase transition from a liquid state to a gas state. The phase transition between the water and the gas can be due to the effects of temperature and/or pressure. In an embodiment, the predetermined temperature of the gas-state heat exchanging fluid can be achieved by applying a predetermined pressure.

The temperature and/or rate of temperature change within each respective heating zone of the first and second heating plates may be independently controlled by altering a temperature of the fluid, a flow rate of the fluid, pressure of the fluid and/or other known methods of temperature control. Further, while the first and second heating plates are designated with the term "heating," it is to be understood that various "cooling" techniques may be used to achieve independent temperature control of the heating zones in accordance with the embodiments herein. In some embodiments, thermoelectric heating and cooling, radiant heating and other temperature control techniques may be used to facilitate independent control of the zones in the first and second heating plates.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A wafer processing system, comprising:
a metrology module configured to measure a wafer to identify a bow measurement of the wafer;

a film formation module configured to form a stressor film on the wafer, the stressor film reactive to heat such that the heat modifies an internal stress of the stressor film; and a bake module having multiple heating zones for differentially heating the stressor film corresponding to the bow measurement, wherein the heating zones of the bake module are provided in a vertical projection area of the wafer and are fixed with respect to each other.

2. The wafer processing system of claim 1, wherein the film formation module is configured to form the stressor film by a spin-on deposition process.

3. The wafer processing system of claim 1, wherein the bake module includes:
   a first hot plate configured to provide uniform heating across a surface of the first hot plate; and
   a second hot plate that includes the multiple heating zones.

4. The wafer processing system of claim 3, wherein the second hot plate includes:
   multiple channels corresponding to the multiple heating zones; and
   a heat exchanging fluid flowing through the channels, temperature of the heat exchanging fluid being controlled based on the bow measurement of the wafer.

5. The wafer processing system of claim 4, wherein the heat exchanging fluid undergoes a phase transition from a fluid state to a gas state.

6. The wafer processing system of claim 5, wherein the temperature of the heat exchanging fluid is controlled by changing a pressure thereof.

7. The wafer processing system of claim 1, wherein the wafer has a working surface and a backside surface opposite to the working surface, and the stressor film is formed on the backside surface of the wafer.

8. A method, comprising:
   receiving a wafer having a working surface and a backside surface opposite to the working surface;
   measuring the wafer to identify a bow measurement of the wafer;
   forming a stressor film on the backside surface of the wafer, the stressor film reactive to heat such that the heat modifies an internal stress of the stressor film; and
   modifying the internal stress of the stressor film using a pattern of heat applied via a hot plate having multiple heating zones, the pattern of heat corresponding to the bow measurement of the wafer,
   wherein the heating zones of the hot plate are provided in a vertical projection area of the wafer and are fixed with respect to each other.

9. The method of claim 8, wherein the working surface of the wafer is with at least partially fabricated devices.

10. The method of claim 8, wherein the wafer has an amount of wafer bow resulting from one or more microfabrication steps.

11. The method of claim 8, wherein the hot plate includes multiple channels corresponding to the multiple heating zones, and the method further comprises:
   injecting a heat exchanging fluid to flow through the channels, temperature of the heat exchanging fluid being controlled based on the bow measurement of the wafer.

12. The method of claim 11, wherein the heat exchanging fluid undergoes a phase transition from a fluid state to a gas state.

13. The wafer processing system of claim 3, wherein the bake module further includes a housing that includes a lower portion where the first hot plate is installed and an upper portion where the second hot plate is installed, the upper portion configured to move vertically to open and close the bake module.

* * * * *